United States Patent
Collin et al.

(10) Patent No.: US 9,941,188 B2
(45) Date of Patent: Apr. 10, 2018

(54) ASSEMBLY OF AN INTEGRATED CIRCUIT CHIP AND OF A PLATE

(71) Applicants: STMicroelectronics (Crolles 2) SAS, Crolles (FR); SOCPRA Sciences et Génie S.E.C., Sherbrooke (CA)

(72) Inventors: Louis-Michel Collin, Saint-Jean-sur-Richelieu (CA); Luc Guy Frechette, Sherbrooke (CA); Sandrine Lhostis, Thonon les Bains (FR)

(73) Assignees: STMicroelectronics (Crolles 2) SAS, Crolles (FR); SOCPRA Sciences et Génie S.E.C., Sherbrooke (CA)

( * ) Notice: Subject to any disclaimer, the term of this patent is extended or adjusted under 35 U.S.C. 154(b) by 0 days.

(21) Appl. No.: 15/414,061

(22) Filed: Jan. 24, 2017

(65) Prior Publication Data

US 2017/0133297 A1  May 11, 2017

Related U.S. Application Data

(62) Division of application No. 14/857,041, filed on Sep. 17, 2015, now Pat. No. 9,589,874.

(30) Foreign Application Priority Data

Dec. 12, 2014  (FR) ...................................... 14 62372

(51) Int. Cl.
*H01L 21/44*  (2006.01)
*H01L 23/42*  (2006.01)
(Continued)

(52) U.S. Cl.
CPC ............ *H01L 23/42* (2013.01); *H01L 21/481* (2013.01); *H01L 21/4853* (2013.01);
(Continued)

(58) Field of Classification Search
CPC ....... H01L 23/42; H01L 21/481; H01L 21/56; H01L 21/4853; H01L 24/11; H01L 24/14; H01L 24/27
(Continued)

(56) References Cited

U.S. PATENT DOCUMENTS 4,513,942 A * 4/1985 Creasman ......... B29C 45/14655
                                                       249/110
6,097,097 A     8/2000 Hirose
(Continued)

FOREIGN PATENT DOCUMENTS

| EP | 1628344 A2 | 2/2006 |
|---|---|---|
| WO | WO-2007071674 A2 | 6/2007 |
| WO | WO-2012005706 A1 | 1/2012 |

OTHER PUBLICATIONS

INPI Search Report and Written Opinion for FR 1462372 dated Nov. 17, 2015 (9 pages).

*Primary Examiner* — Nitin Parekh
(74) *Attorney, Agent, or Firm* — Gardere Wynne Sewell LLP

(57) ABSTRACT

An assembly includes an integrated circuit chip and a plate with at least one heat removal channel arranged between the chip and the plate. Metal sidewalls are formed to extend from one surface of the chip to an opposite surface of the plate. The assembly is encapsulated in a body that includes an opening extending to reach the channel. The plate may be one of an interposer, an integrated circuit chip, a support of surface-mount type, or a metal plate.

21 Claims, 9 Drawing Sheets

(51) Int. Cl.
*H01L 23/498* (2006.01)
*H01L 23/367* (2006.01)
*H01L 21/48* (2006.01)
*H01L 23/00* (2006.01)
*H01L 21/56* (2006.01)

(52) U.S. Cl.
CPC .......... *H01L 21/56* (2013.01); *H01L 23/3672* (2013.01); *H01L 23/49811* (2013.01); *H01L 24/11* (2013.01); *H01L 24/13* (2013.01); *H01L 24/14* (2013.01); *H01L 24/27* (2013.01); *H01L 24/29* (2013.01); *H01L 24/73* (2013.01); *H01L 2224/11462* (2013.01); *H01L 2224/13078* (2013.01); *H01L 2224/13147* (2013.01); *H01L 2224/14151* (2013.01); *H01L 2224/14154* (2013.01); *H01L 2224/14177* (2013.01); *H01L 2224/27462* (2013.01); *H01L 2224/29013* (2013.01); *H01L 2224/29147* (2013.01); *H01L 2224/30151* (2013.01); *H01L 2224/73103* (2013.01); *H01L 2224/73203* (2013.01)

(58) Field of Classification Search
USPC ........................................................ 438/613
See application file for complete search history.

(56) References Cited

U.S. PATENT DOCUMENTS

| | | |
|---|---|---|
| 8,604,603 B2 | 12/2013 | Lau et al. |
| 8,704,352 B2 | 4/2014 | Hisano et al. |
| 8,860,212 B1 | 10/2014 | Foong et al. |
| 2004/0070083 A1 | 4/2004 | Su |
| 2004/0251530 A1 | 12/2004 | Yamaji |
| 2005/0167829 A1* | 8/2005 | Brunner .............. H01L 21/4853 257/737 |
| 2007/0131645 A1 | 6/2007 | Durocher et al. |
| 2009/0057881 A1 | 3/2009 | Arana et al. |
| 2014/0043757 A1 | 2/2014 | Bernstein et al. |
| 2014/0110859 A1* | 4/2014 | Rafferty .............. H01L 23/4985 257/774 |
| 2014/0264337 A1* | 9/2014 | Chen ................. H01L 25/0652 257/48 |
| 2015/0140801 A1* | 5/2015 | Toh ........................ H01L 24/11 438/613 |

\* cited by examiner

ASSEMBLY OF AN INTEGRATED CIRCUIT CHIP AND OF A PLATE

PRIORITY CLAIM

This application is a divisional application of U.S. patent application Ser. No. 14/857,041, filed on Sep. 17, 2015, which claims the priority benefit of French Application for Patent No. 1462372, filed on Dec. 12, 2014, the disclosures of which are hereby incorporated by reference.

TECHNICAL FIELD

The present disclosure relates to the assembly of an integrated circuit chip and of at least one plate such as a metal plate, another integrated circuit chip, a support, and/or an intermediate plate currently called interposer. The present disclosure also relates to a method of manufacturing such an assembly.

The present disclosure relates to the case where the chip or the plate are individualized components as well as the case where, on assembly, one at least of these components forms a portion of a wafer which has not yet been sawn.

BACKGROUND

To increase the integration density of integrated circuits, integrated circuit chips and plates such as a support, for example, of surface mount type, and/or an interposer, may be assembled on one another. Connection elements such as pads, bumps, and/or pillars arranged between the opposite surfaces of the plates and of the chips of the assembly electrically connect the plates and the chip(s). Interstitial resin occupies the space available between the opposite surfaces of the components of the assembly, be they plates or chips, and encapsulation resin coats these components. The interstitial resin and the encapsulation resin improve the mechanical stability of the assembly and protect, for example, from humidity, the components of the assembly.

In operation, integrated circuits generate heat. The interstitial resin and the encapsulation resin are generally poor heat conductors and the temperature of certain regions of the assembly may increase sufficiently to cause damage. To remove the generated heat, channels conducting a heat-carrying fluid may be formed in the assembly. However, the forming of such channels generally requires specific manufacturing steps.

There thus is a need for an assembly of an integrated circuit chip and of at least one plate such that the assembly comprises a particularly efficient cooling structure, and which requires the smallest possible number of specific steps for its manufacturing, which should be particularly simple and inexpensive to implement.

SUMMARY

Thus, an embodiment provides an assembly of an integrated circuit chip and of a plate, wherein at least one channel arranged between the chip and the plate extends from one edge to another edge of the smallest one of the chip and the plate, and is delimited by metal sidewalls extending at least partially from one surface of the chip to an opposite surface of the chip.

According to an embodiment, the interstitial resin fills, outside of said at least one channel, the volume available between the chip and the plate.

According to an embodiment, said at least one channel extends beyond said edges.

According to an embodiment, the plate is an interposer, an integrated circuit chip, a surface-mount type support, or a metal plate.

According to an embodiment, the sidewalls comprise adjacent aligned metal bumps.

According to an embodiment, encapsulation resin covers the assembly, and openings extend through the encapsulation resin all the way to the ends of said at least one channel.

According to an embodiment, connection elements extend, outside of said at least one channel, from the surface of the chip to the opposite surface of the plate.

Another aspect provides a method of manufacturing a flip-chip assembly of an integrated circuit chip and of a plate between which is arranged at least one channel delimited by metal sidewalls, the method comprising the successive steps of:

a) forming metal walls corresponding to at least a portion of the height of each of the sidewalls on a surface of the chip and/or a surface of the plate;

b) inserting sacrificial resin between the walls of the and/or between the walls of the chip, at least at the level of the contour of the smallest one of the plate and the chip;

c) mounting the chip and the plate on each other, the sidewalls being formed by the walls and extending at least partially from the surface of the chip to the surface of the plate; and d) removing the sacrificial resin.

According to an embodiment, the walls are formed at the same time as the connection elements arranged between the opposite surfaces of the chip and of the plate.

According to an embodiment, at step c), the sacrificial resin extends along the entire length of said at least one channel, up to a portion at least of the height of the walls.

According to an embodiment, at step c), the walls extend totally from the surface of the chip to the surface of the plate, the sacrificial resin totally obstructing said at least one channel at the level of said contour.

According to an embodiment, before step d), interstitial resin is arranged in the entire volume accessible between the chip and the plate.

According to an embodiment, encapsulation resin is arranged on the largest one of the chip or of the plate to form the upper surface of the assembly and, before the removal of the sacrificial resin, openings are formed through the encapsulation resin all the way to the sacrificial resin.

According to an embodiment, a plurality of channels are simultaneously formed and, at step b), the sacrificial resin arranged on the surface of the largest one of the chip or of the plate further extends along strips orthogonal to the channels, the strips being arranged to contact the sacrificial resin extending between the walls at the level of their ends.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

Figure 1A:
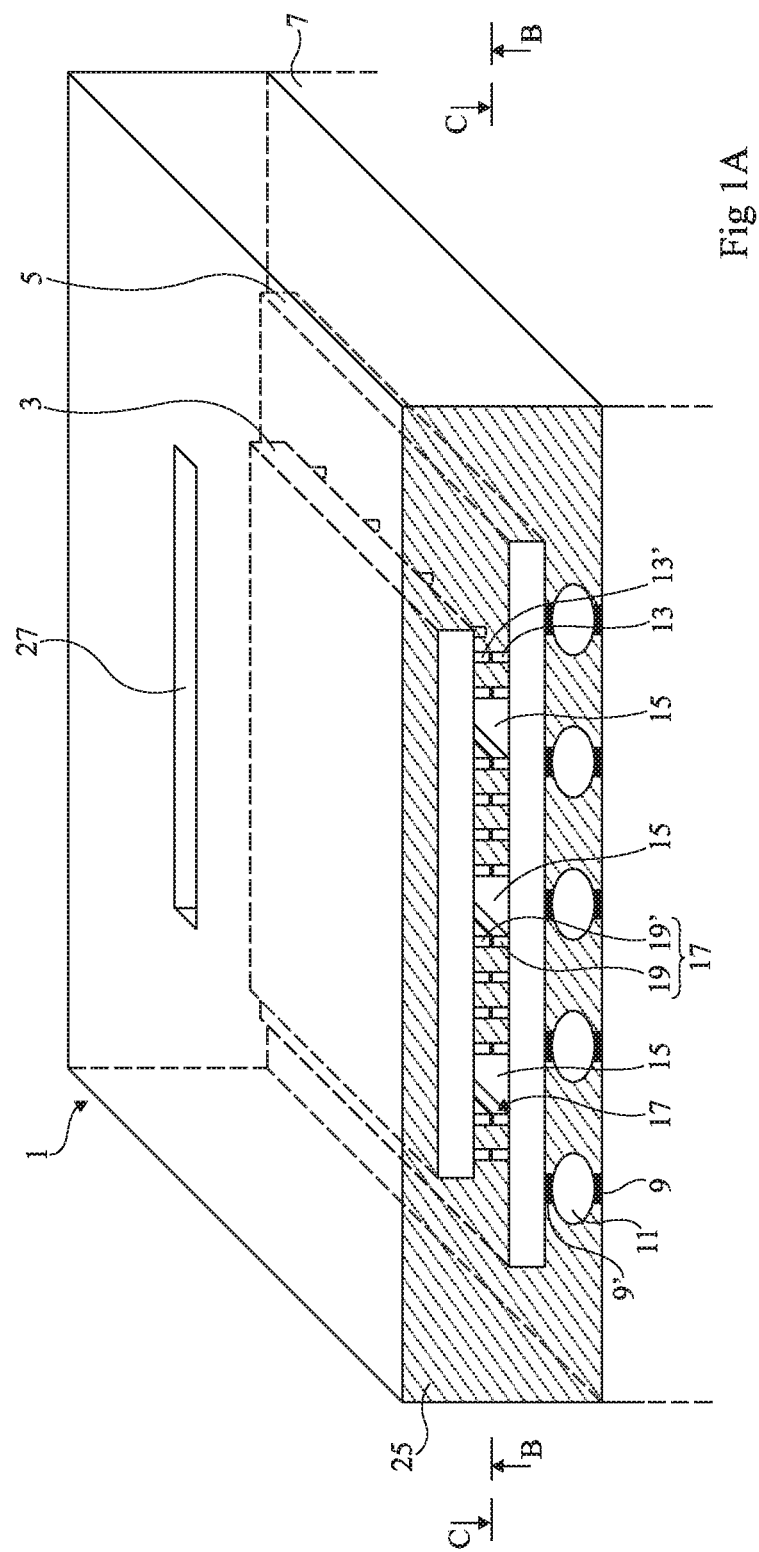
FIGS. 1A, 1B, and 1C schematically show a first example of an assembly of a chip and of plates, the assembly comprising heat removal channels.

For clarity, the same elements have been designated with the same reference numerals in the different drawings. Further, in the following description, terms such as "upper", "lower", "top", "lateral", "topped", etc., apply to assemblies oriented as illustrated in the corresponding drawings, it being understood that, in practice, the devices may have different orientations. Further, terms such as "substantially", "slightly", etc. should be interpreted as meaning "to within 10%".

Figure 1B:
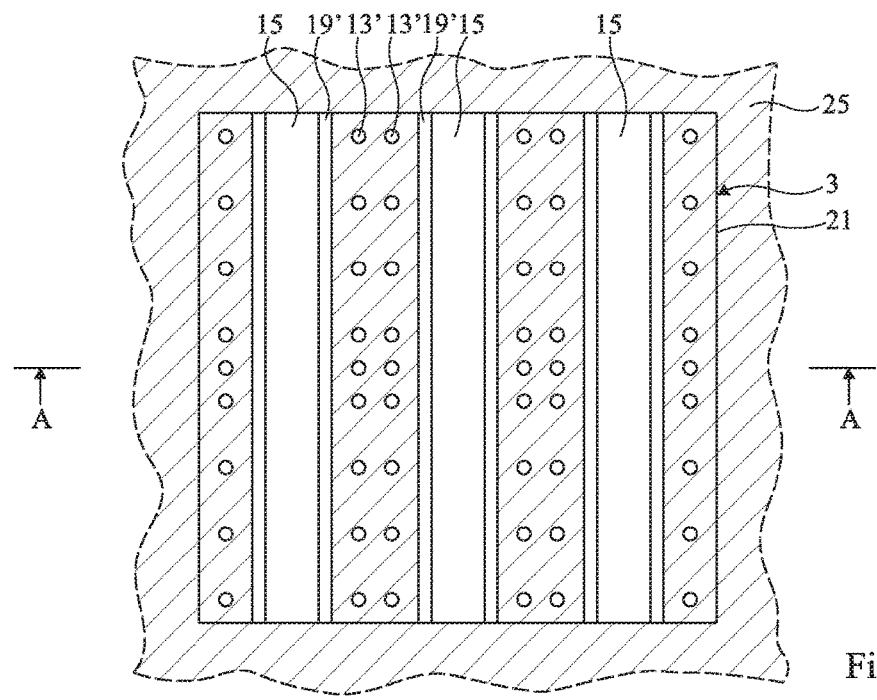
Figure 1C:
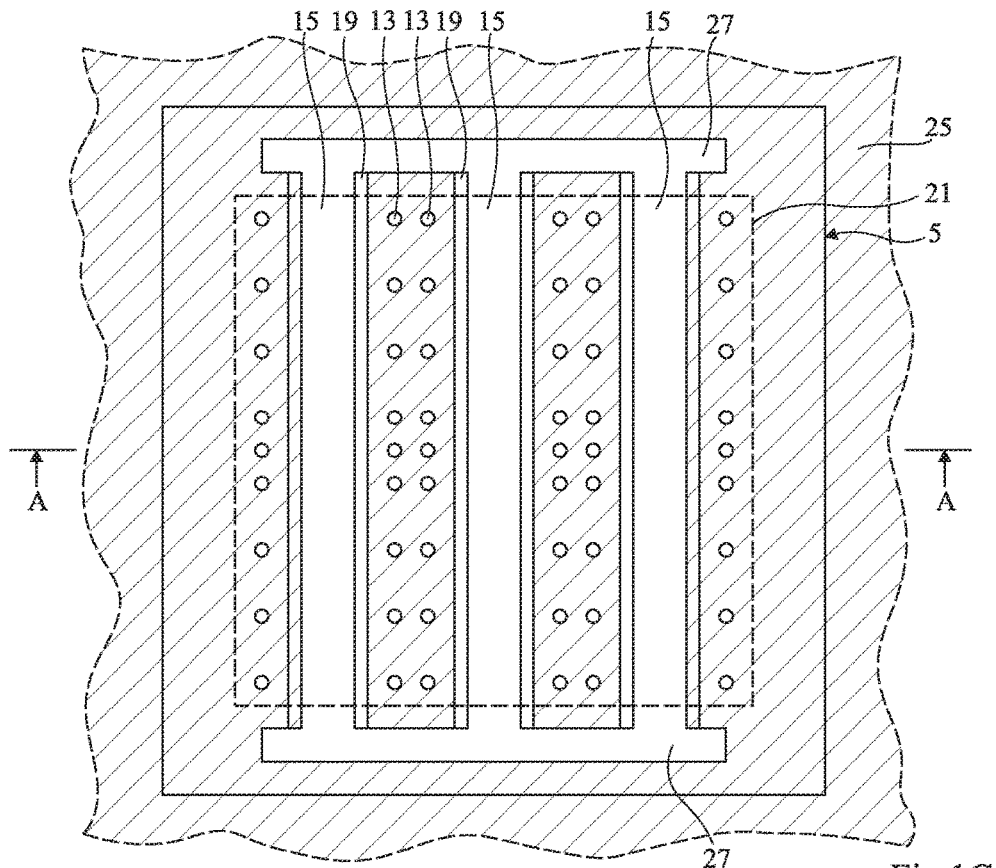

FIGS. 1A, 1B, and 1C schematically show a first example of assembly of chips and of plates. FIG. 1A is a perspective cross-section view along plane AA of FIGS. 1B and 1C, and FIGS. 1B and 1C are cross-section views of the assembly, respectively along planes BB and CC of FIG. 1A.

In FIG. 1A, assembly 1 comprises one chip 3 and two plates, that is, in this example, an interposer 5 and a support 7 of surface-mount type. Chip 3 is mounted on interposer 5, itself being mounted on support 7. Electrically-conductive pads 9 and 9' are supported by the opposite surfaces of support 5 and of interposer 7. Metal bumps 11 connect a pad 9 to an opposite pad 9'. Metal pillars 13 and 13' are supported by the opposite surfaces of interposer 5 and of chip 3, each pillar 13 being connected to an opposite pillar 13' by a soldering to form elements of connection between the chip and the interposer.

In this first example of assembly, three heat removal channels 15 parallel to one another are arranged between interposer 5 and chip 3, pillars 13 and 13' being distributed outside of the channels. Each channel 15 is laterally delimited by metal sidewalls 17 extending from the upper surface of interposer 5 to the lower surface of chip 3. Each sidewall 17 comprises a metal wall 19 supported by the upper surface of the interposer and a metal wall 19' supported by the lower surface of chip 3, wall 19 being connected to wall 19' by a soldering. In this example, walls 19 and 19' are metal lines made of the same material as pillars 13 and 13'. In the shown example, chip 3 and interposer 5 are rectangular, and chip 3 has a smaller surface area than interposer 5. As shown in FIG. 1C, on the interposer side, each wall 19 extends from a first edge to a second opposite edge of contour 21 of the projection of chip 3 on interposer 5, and may extend out of contour 21 of the chip, on either side of the first and second edges. As shown in FIG. 1B, on the chip side, each wall 19' extends from the first edge to the second edge of contour 21 of chip 3.

Outside of channels 15, resin 25 fills, around pillars 13 and 13', the entire free space between chip 3 and interposer 5. Resin 25 also fills the free space between interposer 5 and support 7. In the shown example, resin 25 extends from the upper surface of support 7 all the way to the upper surface of chip 3 to coat the chip and interposer 5, and to form the upper surface of assembly 1. Resin 25 is thus used as encapsulation resin and as interstitial resin.

Two openings 27 cross resin 25, from the upper surface of the assembly all the way to the upper surface of interposer 5, the openings being arranged, as illustrated in FIG. 1C, outside of contour 21 of chip 3, on either side of the first and second edges of contour 21. Each channel 15 emerges, at one of its ends, into one of openings 27, and, at its other end, into the other opening 27. Thus, a heat-carrying fluid may flow from one opening 27 to the other through channels 15.

Due to the fact that sidewalls 17 of channels 15 are metallic and are thermally conductive, they take part in the heat removal, which improves the cooling efficiency. In addition to taking part in the heat removal, metal sidewalls 17 enable to reinforce the assembly of chip 3 and of interposer 5 despite the absence of resin 25 in channels 15.

The lower surface of chip 3 may correspond to the active surface of the chip where the heat-generating integrated circuits are formed. In this case, channels 15 are arranged close to the integrated circuits, which enables a more efficient removal of heat.

According to a first alternative embodiment, channels 15 extend from the upper surface of interposer 5 up to a height substantially equal to that of walls 19, the space between each channel 15 and the lower surface of chip 3 being occupied by resin 25. In this variation, walls 19' may be absent.

According to a second alternative embodiment, channels 15 extend from the lower surface of chip 3 up to a height substantially equal to that of walls 19', the space between each channel 15 and the upper surface of interposer 5 being occupied by resin 25, with the possibility for walls 19 to be absent. In this variation, it is provided for openings 27 to border or to overlap the first and second edges of contour 21 of chip 3.

FIGS. 2 to 6 schematically illustrate successive steps of a method of manufacturing an assembly of the type in FIGS. 1A to 1C, and more particularly an assembly where three channels parallel to one another are arranged between opposite surfaces of a plate 5 and of an integrated circuit chip 3, pillars electrically connecting chip 3 and plate 5 being distributed outside of the channels. Plate 5 may be an integrated circuit chip, a support of surface-mount type, or an interposer.

Figure 2:
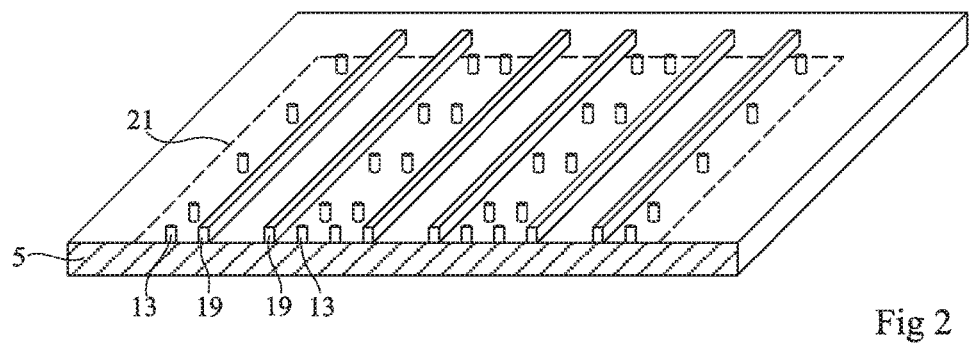
FIGS. 2 to 6 are perspective cross-section views illustrating successive steps of a method of manufacturing an assembly of the type in FIGS. 1A to 1C.

FIG. 2 is a perspective cross-section view schematically showing one half of plate 5 of FIG. 1A after the forming, at the same time and with the same material, of metal pillars 13 and of metal walls 19 on its upper surface intended to be opposite chip 3. The length of walls 19 is selected so that, once chip 3 has been assembled on plate 5, each wall 19 extends from a first edge to a second opposite edge of contour 21 of the projection of chip 3 on plate 5. As shown, each wall 19 may extend out of contour 21, on either side of the first and second edges of this contour.

Figure 3:
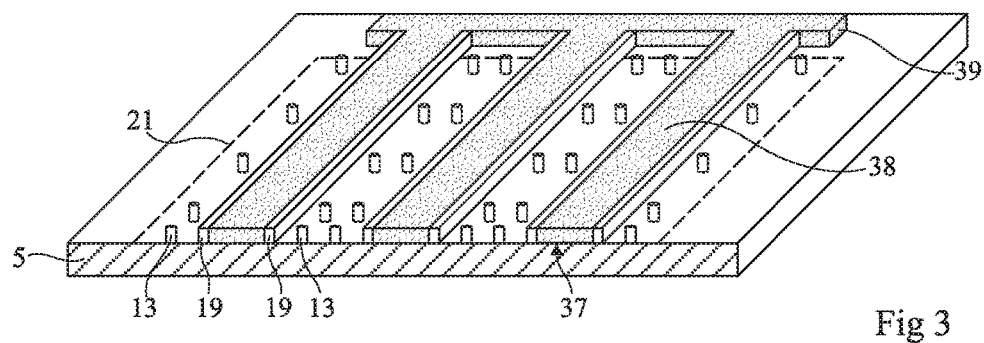

FIG. 3 is a perspective cross-section view schematically showing half of plate 5 after having formed sacrificial resin 37 between the walls (reference 38) and along two strips 39 orthogonal to the walls. Strips 39 (a single one of which is shown) are arranged outside of contour 21, on both sides of this contour, to contact sacrificial resin 38 at the ends of walls 19. In this example, resin layer 37 has substantially the same height as walls 19. Sacrificial resin 37 is for example formed by deposition and etching.

Figure 4:
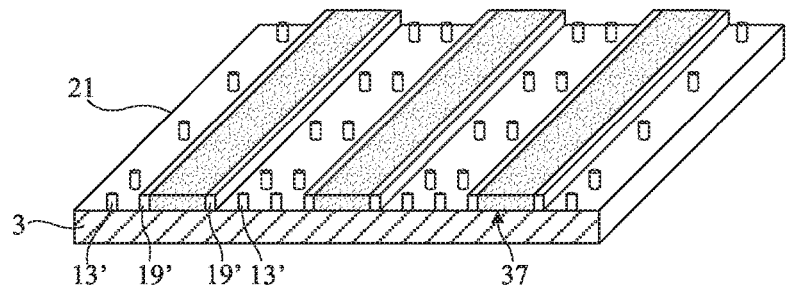

FIG. 4 is a perspective cross-section view schematically showing one half of chip 3 after the forming, at the same time and with the same material, of pillars 13' and of walls 19' on its upper surface intended to be opposite plate 5. Each wall 19' extends from the first edge to the second opposite edge of contour 21 of chip 3. A sacrificial resin layer 37 has been formed, by deposition and etching, between walls 19', and extends from the first to the second edge of the chip. In this example, resin layer 37 has substantially the same height as walls 19'.

As an example, pillars 13 and 13' and walls 19 and 19' are formed by electrochemical deposition (ECD) of a metal, for example, copper. Pillars 13 and walls 19 have a same height and, similarly, pillars 13' and walls 19' have a same height. The heights of walls 19 and 19' are for example in the range from 5 to 200 µm, and may be equal to 50 µm. The width of a channel, that is, the space between two walls 19 or 19', is for example in the range from 5 to 1,000 µm, and may be equal to 100 µm. It should be understood that in practice, the opposite surfaces of chip 3 and of plate 5 support a number of pillars 13' and 13 much higher than that shown in FIGS. 2, 3, and 4, for example, more than 500 pillars per surface.

Figure 5:
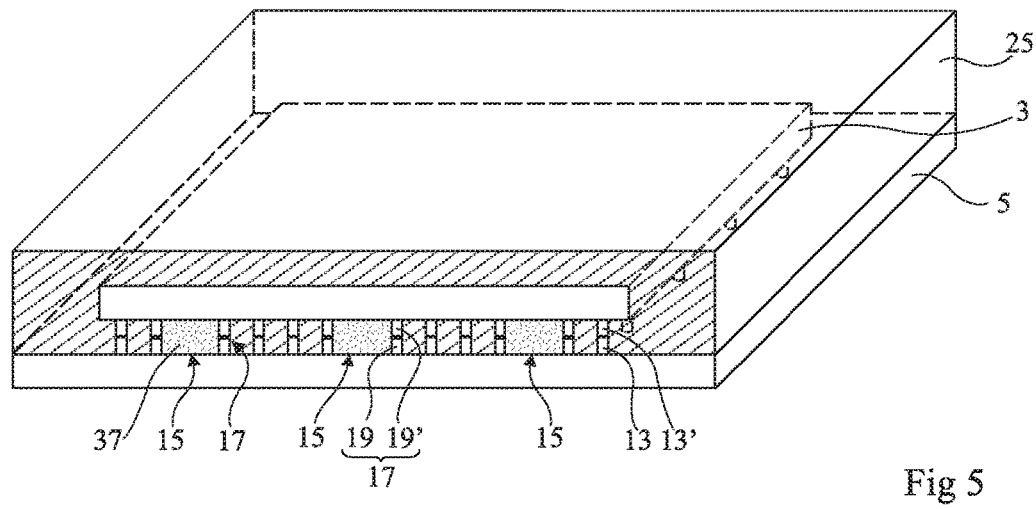

FIG. 5 is a cross-section perspective view schematically showing plate 5 of FIG. 3 and chip 3 of FIG. 4 after assembly. The assembly is performed by flipping chip 3, pillars 13 and walls 19 being respectively placed opposite pillars 13' and walls 19', and then by soldering pillars 13 to pillars 13', and walls 19 to walls 19'. Each assembly of a pillar 13 and of a pillar 13' forms a connection element connecting a pad of plate 5 to an opposite pad of chip 3. Each assembly of a wall 19 and of a wall 19' forms a sidewall 17 of a channel 15. The assembly of chip 3 and of plate 5 may be mounted on another plate, for example, a support plate as illustrated in FIG. 1A.

Encapsulation resin 25 is arranged on the upper surface of plate 5 all the way to above the upper surface of chip 3 to coat chip 3, and to form the upper surface of the assembly. Encapsulation resin 25 penetrates by capillary action into the entire free volume accessible between plate 5 and chip 3, and, due to the presence of sacrificial resin 37 in channels 15, resin 25 does not penetrate into channels 15. In this example, encapsulation resin 25 is also used as an interstitial resin.

Figure 6:
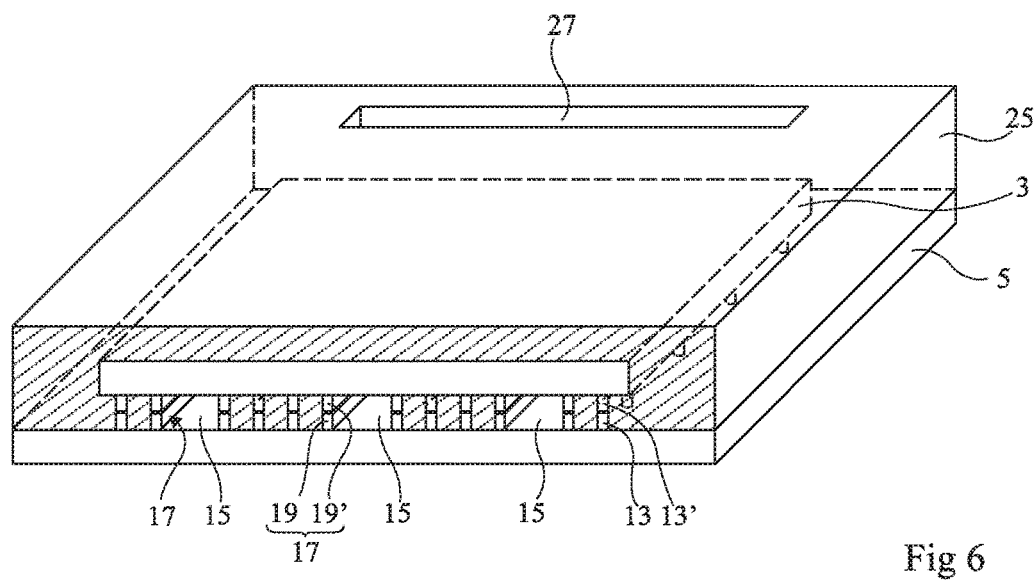

FIG. 6 is a perspective cross-section view of the assembly of FIG. 5 after two openings 27 have been formed. Openings 27 (a single one of which is shown) extend from the upper surface of the assembly all the way to strips 39 of sacrificial resin (see FIG. 3), substantially along the same pattern. As an example, openings 27 are formed by laser drilling.

Sacrificial resin 37 is dissolved by a solvent which penetrates through openings 27. Once resin 37 has been removed, openings 27 providing access to the channels and channels 15 such as those described in relation with FIGS. 1A to 1C are obtained, and a heat-carrying fluid may flow from one opening 27 to another through channels 15. As an example, sacrificial resin 37 is a hydrosoluble resin; in this case, the solvent used is water.

The manufacturing method described in relation with FIGS. 2 to 6 is likely to have many variations, particularly as concerns the interstitial resin. According to a first variation, interstitial resin may be injected between chip 3 and plate 5 while they are assembled on each other, but before forming encapsulation resin. According to a second variation, interstitial resin is arranged on plate 5, after the step illustrated in FIG. 3, but before assembling chip 3 and plate 5. In this case, the interstitial resin extends up to a height greater than or equal to that of the space between chip 3 and plate 5 once mounted on each other. At the time of the assembly, the interstitial resin is softened by heating so that pillars 13' and walls 19' supported by chip 3 penetrate into the interstitial resin all the way to pillars 13 and to walls 19 supported by plate 5. This second variation may in particular be used in the case where, at the time of the assembly, plate 5 forms a portion of a wafer which has not been sawn yet.

Various variations may be provided, in particular, as concerns the deposition of sacrificial resin 37. According to a first variation, it is possible to deposit the sacrificial resin on plate 5 only and not on chip 3. It may also be provided not to form walls 19' or for the sacrificial resin deposited on plate 5 to form an overthickness so that it at least partially extends between walls 19' of chip 3 when the latter is mounted on plate 5. According to a second variation, it is possible to deposit sacrificial resin 37 on chip 3 only and not on plate 5. It may then be provided not to form walls 19 or for the sacrificial resin deposited on plate 3 to form an overthickness so that it at least partially extends between walls 19 of plate 5 when the latter is mounted on chip 3. In this second variation, it is provided for openings 27 to extend from the upper surface of the assembly all the way to plate 5 and to border or overlap the first and second edges of chip 3. According to another variation, it may be provided for sacrificial resin 37 to be formed, between walls 19 and 19', only at the level of contour 21 of chip 3 to obstruct the channels at their ends when chip 3 is mounted on plate 5 and for walls 19 and 19' to form a continuous partition between chip 3 and plate 5 due to a soldering.

Figure 7A:
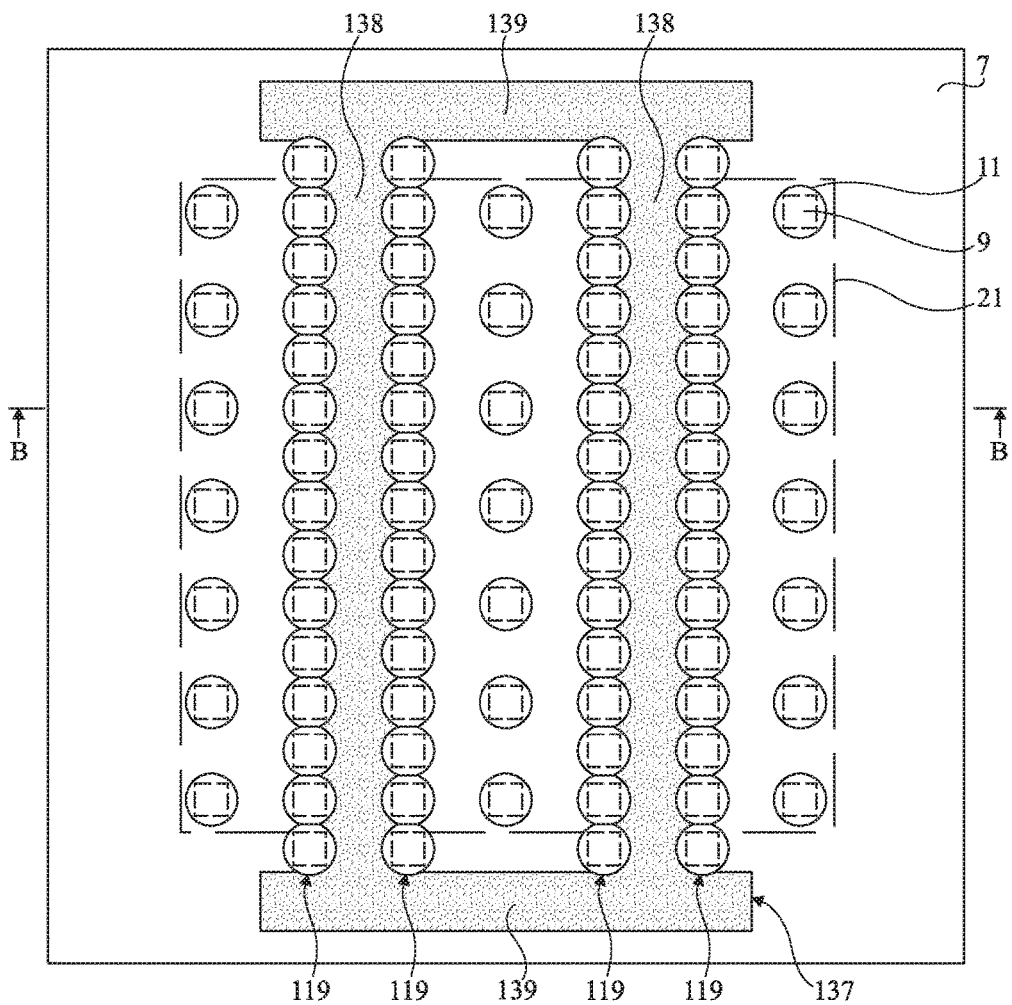
FIGS. 7A, 7B, and 8 illustrate successive steps of a method of manufacturing a second type of assembly.
Figure 7B:
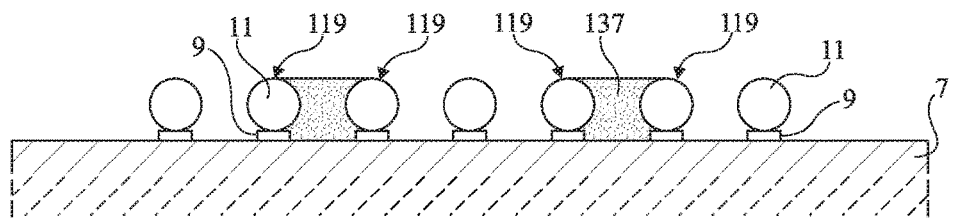
Figure 8:
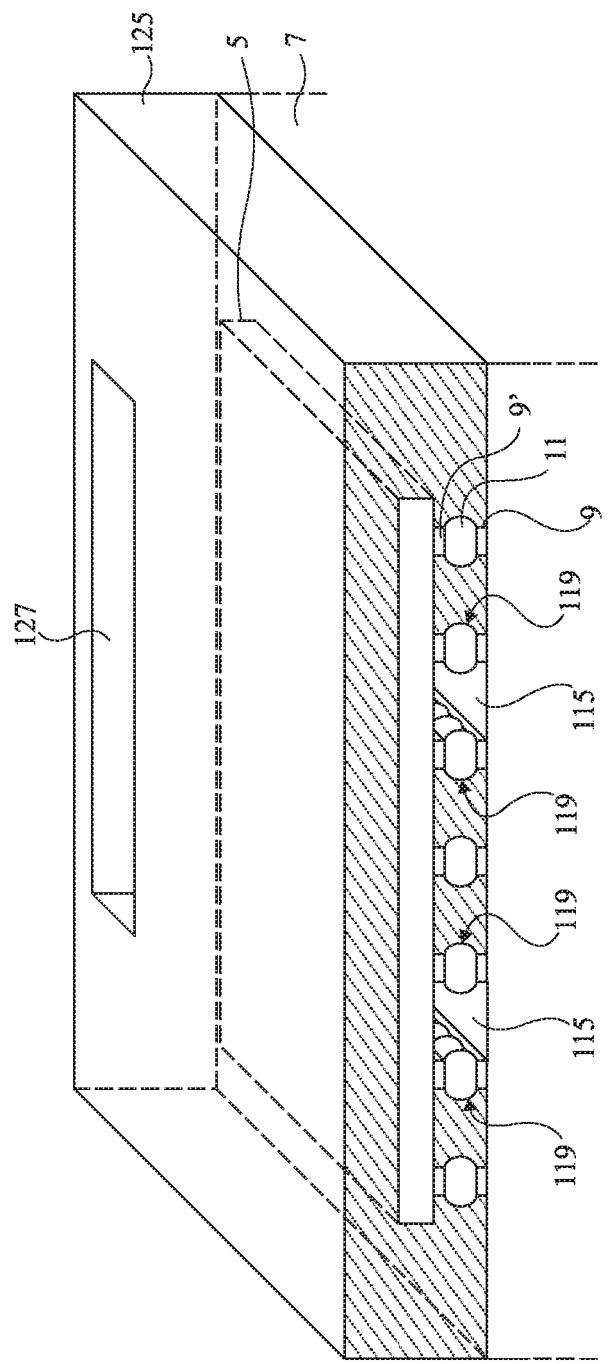

FIGS. 7A-7B and 8 schematically illustrate successive steps of a method of manufacturing a second example of assembly, and more particularly an assembly where two channels parallel to each other are arranged between opposite surfaces of two plates 5 and 7, metal bumps 11 electrically connecting opposite pads 9 and 9' of these plates being distributed outside of these channels. In this example, plate 5 is an integrated circuit chip and plate 7 is a surface-mount type support, support 7 and chip 5 being rectangular, and the surface area of support 7 being greater than that of chip 5.

FIGS. 7A-7B schematically show support 7 after the forming of pads 9 topped with bumps 11 on its upper surface intended to be opposite chip 5, FIG. 7A being a top view of the support and FIG. 7B being a cross-section view along plane BB of FIG. 7A. As shown in FIG. 7A, some of bumps 11 form lines of bumps forming walls 119. The length of walls 119 with respect to the dimensions of contour 121 of the projection of chip 5 on support 7 is selected as described in relation with FIG. 3.

Sacrificial resin 137 is formed, by deposition and etching, to extend between walls 119 (reference 138), and along two strips 139 orthogonal to the walls as described in relation with FIG. 3.

FIG. 8 is a perspective cross-section view schematically showing chip 5 and support 7 of FIGS. 7A-7B after assembly of the chip on the support. The surface of chip 5 intended to be opposite support 7 supports pads 9'. The assembly of chip 5 on support 7 is performed by arranging each pad 9' of the chip opposite a bump 11 supported by a pad 9 of support 7, and then by heating and applying a pressure on the upper surface of chip 5 so that each bump 11 connects a pad 9 of support 7 to a pad 9' of chip 3. Thus, walls 119 of bumps 11 and sacrificial resin 137 between the walls (reference 138) extend from the surface of support 7 to the opposite surface of chip 5. As shown, during the assembly, bumps 11 are slightly crushed.

As in the manufacturing method described in relation with FIGS. 2 to 6, resin 125 coats the assembly and penetrates by capillary action into the entire free volume accessible between plate 5 and chip 3.

Openings 127 formed in resin 125 extend from the upper surface of the assembly all the way to sacrificial resin strips 139 (see FIG. 7A), substantially along the same pattern.

Sacrificial resin 137 is then removed to obtain channels 115 extending from one opening 127 to the other, channels 115 having metal sidewalls.

As an example, pads 9 and 9' are made of copper. Bumps 11 are for example made of a metal or of a hard metallic alloy coated with a solder material. The diameter of bumps 11 may be in the range from 20 to 200 µm, and is for example equal to 100 µm. The pad thickness may be in the range from 1 to 50 µm, and is for example equal to 25 µm.

The method described in relation with FIGS. 7A-7B and 8 is likely to have various alterations and modifications such as for example described in relation with the embodiment of FIGS. 2 to 6. It may further be provided for bumps 11 of a wall 119 to be arranged between metal tracks supported by the chip and by the plate rather than between adjacent pads 9 and 9'.

FIGS. 9 to 12 illustrate successive steps of a method of manufacturing an example of heat removal channels arranged on a surface of an integrated circuit chip 3, and more particularly channels arranged between this chip and a metal plate inserted into resin encapsulating the chip.

Figure 9:
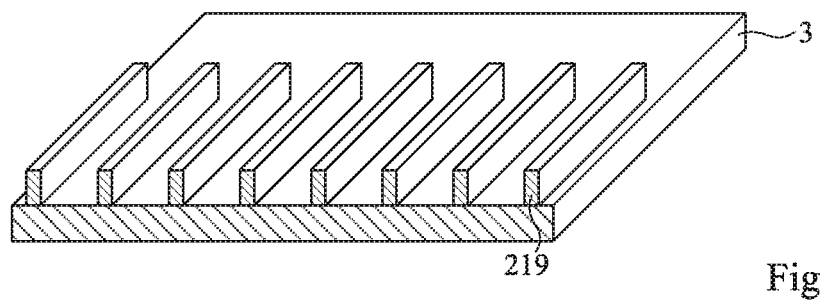
FIGS. 9 to 12 are cross-section perspective views illustrating successive steps of a method of manufacturing an example of heat discharge channels arranged on a surface of a plate.

FIG. 9 is a perspective cross-section view schematically showing one half of chip 3 after the forming of metal walls 219 on its upper surface. As compared with the contour of the projection of the metal plate on the chip, walls 219 extend similarly to what has been previously described. As an example, the wall height may be in the range from 1 to 200 µm, and is for example equal to 50 µm. The walls are for example formed by electrodeposition of a metal, for example, copper.

Figure 10:
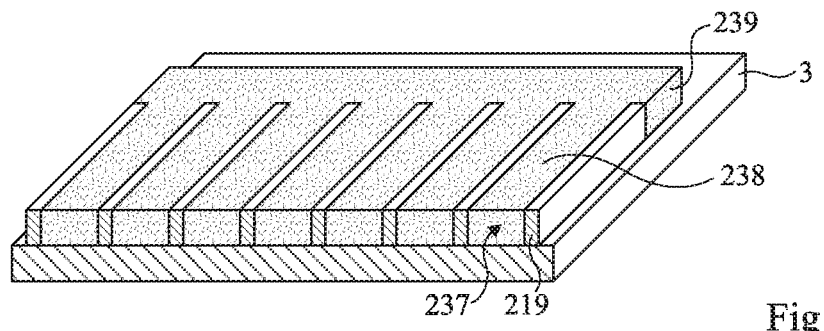

FIG. 10 is a perspective cross-section view schematically showing half of chip 3 of FIG. 9 after the forming, by deposition and etching, of sacrificial resin 237 extending between metal walls 219 (reference 238) and along two strips 239 (a single one of which is shown) orthogonal to the walls. Strips 239 are arranged to be in contact with sacrificial resin 238 at the ends of walls 219.

Figure 11:
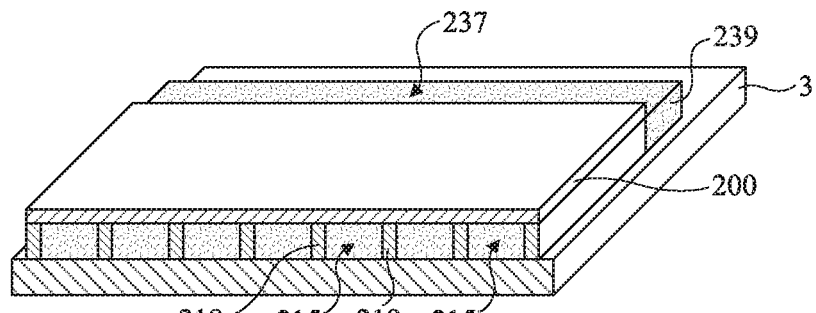

FIG. 11 is a cross-section perspective view of half of chip 3 of FIG. 10 and of one half of a metal plate 200 assembled, for example, by soldering, on wall 219 of the chip.

Figure 12:
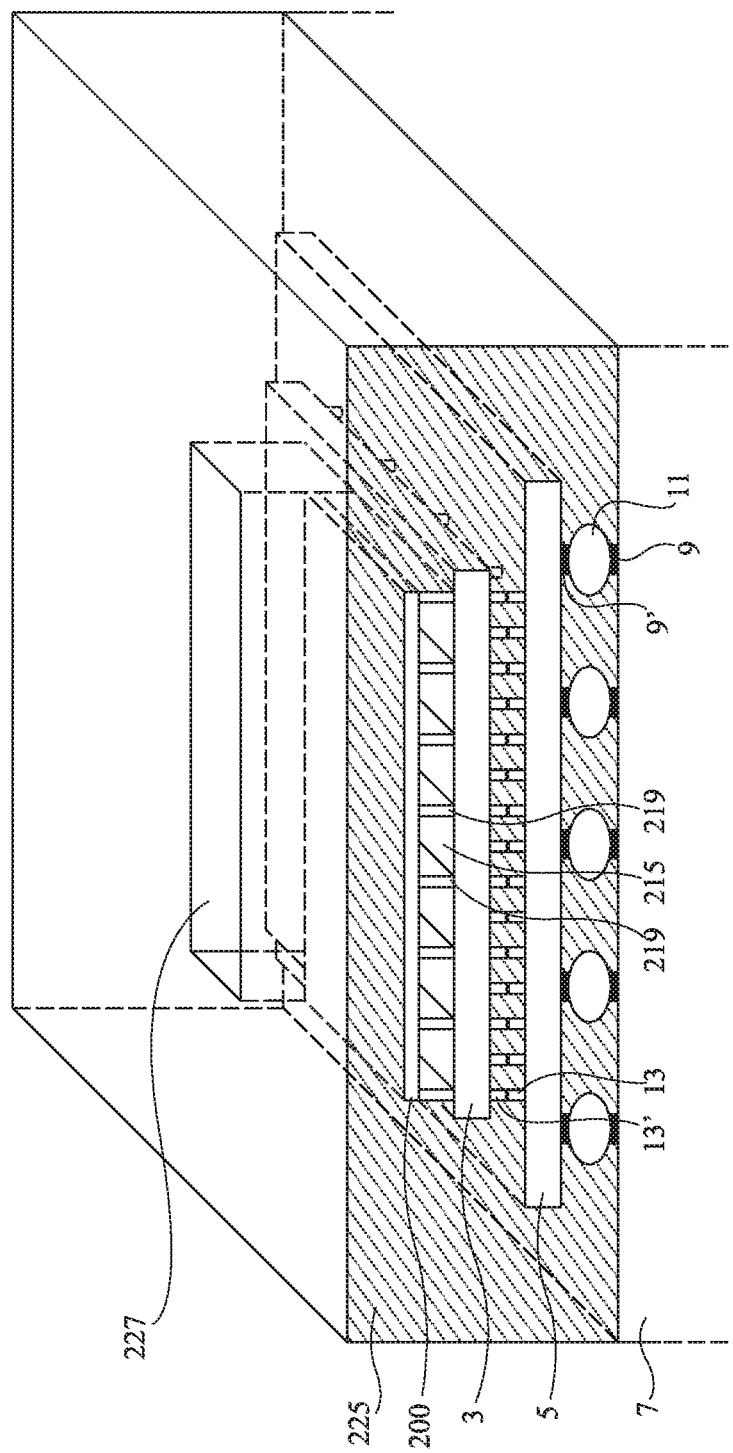

FIG. 12 is a perspective cross-section view showing the assembly of plate 200 and of chip 3 after mounting on a plate 5, itself mounted on a support 7. Pillars 13 and 13' connect opposite pads of chip 3 and of plate 5, and bumps 11 connect opposite pads 9 and 9' of plate 5 and of support 7.

Encapsulation resin 225 is arranged on the upper surface of support 7 all the way to a level higher than or equal to that of the upper surface of metal plate 200 to coat plate 200, chip 3, and plate 5, and to form the upper surface of the assembly. Encapsulation resin 225 penetrates by capillary action between support 7 and plate 5, and between plate 5 and chip 3, resin 225 occupying all the accessible free space between these components.

Two openings 227 (a single one of which is shown) are formed through resin 225, each opening 227 extending from the upper surface of the assembly all the way to a strip 239 of sacrificial resin 237. As previously, sacrificial resin 237 is then removed to obtain channels 215 provided with metal sidewalls.

According to a variation, it is possible to only arrange sacrificial resin between some of walls 219, and, after removal of the sacrificial resin, interstitial resin separates some of channels 215.

FIGS. 13 and 14A-14C schematically illustrate successive steps of a method of manufacturing another example of heat removal channels arranged on a surface of an integrated circuit chip 3.

Figure 13:
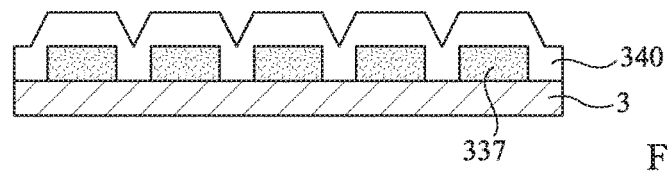
FIGS. 13 and 14A-14C schematically illustrate successive steps of a method of manufacturing another example of heat removal channels arranged on a surface of a plate.

FIG. 13 is a cross-section view showing chip 3 after the forming on its upper surface, by deposition and etching, of strips of sacrificial resin 337 parallel to one another. A metal layer 340, for example, a copper layer, is arranged over the entire upper surface of chip 3 and covers resin strips 337.

Figure 14A:
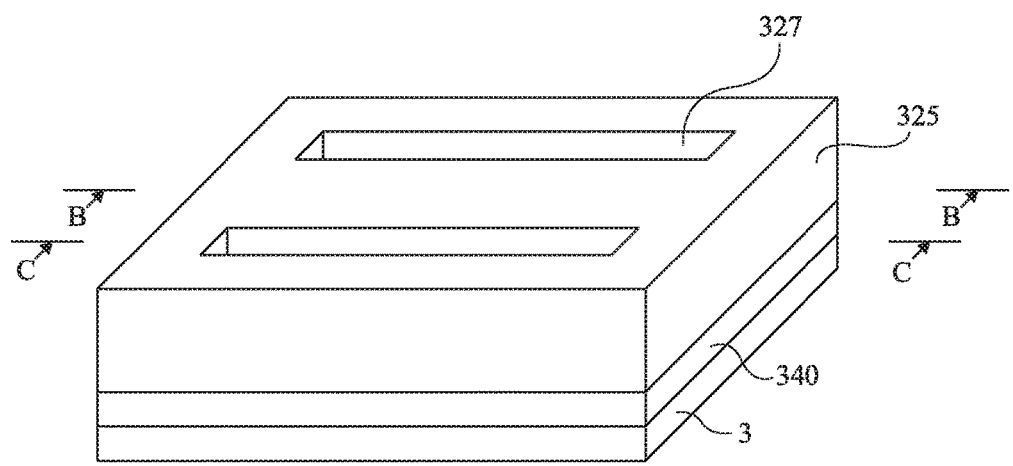
Figure 14B:
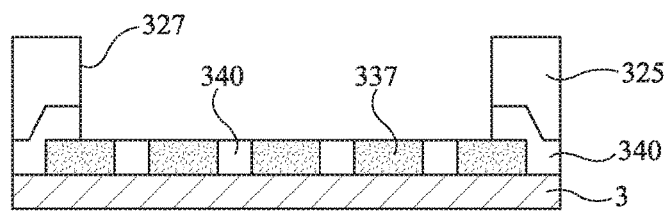
Figure 14C:
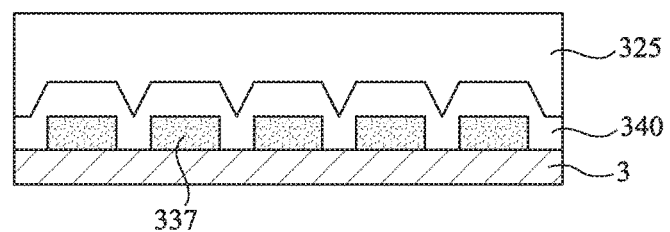

FIGS. 14A to 14C show chip 3 of FIG. 13 at a next step, FIG. 14A being a perspective view and FIGS. 14B and 14C being cross-section views along planes BB and CC of FIG. 14A. Encapsulation resin 325 is arranged on metal layer 340 to cover the latter. In this example, the upper surface of resin 325 is planar. Openings 327 are formed through the encapsulation resin to reach the ends of sacrificial resin strips 337. At a next step, not shown, the sacrificial resin is removed to obtain heat removal channels, five in the present example, metal layer 340 forming the sidewalls and the upper wall of each channel.

A common feature of all the previously-described embodiments is that the sidewalls of the heat removal channels are metallic and thermally conductive. The conductive sidewalls enable to better distribute heat peaks and increase the cooling efficiency. Further, the metal sidewalls of the channels enable to reinforce the mechanical strength of the assembly, despite the absence of interstitial resin in the channels.

In the context of the manufacturing methods described in relation with FIGS. 2 to 6 and with FIGS. 7A-7B and 8, the channels are formed between the opposite surfaces of two plates electrically connected to each other by connection elements. In such manufacturing methods, the channel sidewalls are formed at the same time and with the same materials as the connection elements and imply no specific manufacturing steps other than the deposition of a sacrificial resin.

Specific embodiments have been described. Various alterations, modifications, and improvements will readily occur to those skilled in the art. In particular, the shape, the dimensions, the number, and the location of the channels and of the openings may be adapted by those skilled in the art.

It is possible for the channels not to be rectilinear and/or not to be parallel to one another. They may have a non-constant width. It may also be provided for one or a plurality of pads, tracks, bumps, or pillars to be arranged within a channel.

The openings for accessing the channels may directly emerge on the channel ends, no connection strap being provided between these ends. It may also be provided for the channels to extend all the way to the lateral edges of the assembly, in which case the access openings become useless.

Although channels arranged between a chip and a plate of an assembly have been described, it should be understood that channels may be formed between two plates of an assembly, neither of which is an integrated circuit chip. For example, channels may be formed between an interposer and a support of surface-mount type.

Different examples of channel manufacturing methods have been described, and it should be understood that the order of the steps indicated in these methods can be modified and adapted by those skilled in the art. For example, in the method described in relation with FIGS. 9 to 12, one may first form a sacrificial resin layer, etch this layer a first time so that it can be used as a mask during the forming of the walls, and then etch this layer a second time so that it extends as illustrated in FIG. 10.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing a flip-chip assembly of an integrated circuit chip and of a plate between which is arranged at least one channel delimited by metal sidewalls, the method comprising the steps of:
   a) forming metal walls corresponding to at least part of a height of each of the sidewalls on one of a surface of the integrated circuit chip or a surface of the plate;
   b) inserting sacrificial resin between the metal walls extending to at least a contour of a smaller one of the plate and the integrated circuit chip;
   c) mounting the integrated circuit chip and the plate on each other, the sidewalls being formed by the metal walls extending from the integrated circuit chip surface to the plate surface; and
   d) removing the sacrificial resin.

2. The method of claim 1, wherein the metal walls are formed at the same time as connection elements arranged between opposite surfaces of the integrated circuit chip and of the plate.

3. The method of claim 1, wherein at step c), the sacrificial resin extends along an entire length of said at least one channel and to a height of the sidewalls.

4. The method of claim 1, wherein at step c), the sidewalls extend from the integrated circuit chip surface to the plate surface, the sacrificial resin fully obstructing said at least one channel to said contour.

5. The method of claim 1, wherein, before step d), an interstitial resin is arranged in an entire volume accessible between the integrated circuit chip and the plate.

6. The method of claim 1, wherein an encapsulation resin is arranged on a larger one of the integrated circuit chip and the plate to form an upper surface of the assembly and, before removal of the sacrificial resin, forming openings through the encapsulation resin extending to the sacrificial resin.

7. The method of claim 1, wherein a plurality of channels are simultaneously formed and, at step b), the sacrificial resin arranged on the surface of the larger one of the integrated circuit chip and the plate further extends along strips orthogonal to the channels, the strips being arranged to contact the sacrificial resin.

8. A method, comprising:
   forming metal sidewalls defining a channel on a first surface of an integrated circuit chip;
   filling the channel with a sacrificial material;
   mounting a plate to tops of the metal sidewalls;
   encapsulating the integrated circuit chip and plate with an encapsulating body;
   forming an opening in the encapsulating body to expose the sacrificial material; and
   removing the sacrificial material through said opening so as to open the channel defined by the metal sidewalls.

9. The method of claim 8, wherein the plate is one of an interposer, an integrated circuit chip, a surface-mount support plate, or a metal plate.

10. The method of claim 8, wherein the metal sidewalls comprise aligned adjacent metal bumps.

11. The method of claim 8, wherein the metal sidewalls comprise continuous metal strips.

12. The method of claim 11, wherein forming the metal sidewalls comprises electrodeposition of the continuous metal strips.

13. A method, comprising:
   forming first metal sidewalls on a first surface of an integrated circuit chip;
   forming second metal sidewalls on a second surface of a plate;
   depositing a sacrificial material on the first surface between adjacent first metal sidewalls;
   depositing the sacrificial material on the second surface between adjacent second metal sidewalls;
   mounting the plate to the integrated circuit chip such that the first surface of the integrated circuit chip faces the second surface of the plate and the first metal sidewalls on the first surface of the integrated circuit chip are joined to corresponding second metal sidewalls on the second surface of the plate;
   encapsulating the integrated circuit chip and the plate with an encapsulating material;
   forming a plurality of openings in the encapsulating material to expose the sacrificial material; and
   removing the sacrificial material to open a channel defined by the joined first and second metal sidewalls.

14. The method of claim 13 wherein the integrated circuit chip is larger than the plate and the sacrificial material deposited on the integrated circuit chip is further deposited in a strip orthogonal to the first metal sidewalls.

15. The method of claim 13 wherein forming the first metal sidewalls on the first surface of the integrated circuit chip comprises a first electrodeposition of first copper strips and forming the second metal sidewalls on the second surface of the plate comprises a second electrodeposition of second copper strips.

16. The method of claim 13 further comprising forming pillars on the first surface of the integrated circuit chip, the pillars formed of a same material as the first metal sidewalls.

17. The method of claim 13 wherein the first metal sidewalls are formed at the same time as first connection elements are formed on the first surface of the integrated circuit chip and the second metal sidewalls are formed at the same time as second connection elements are formed on the second surface of the plate.

18. The method of claim 13 wherein the plate is larger than the integrated circuit chip and the sacrificial material deposited on the plate is further deposited in a strip orthogonal to the second metal sidewalls.

19. A method, comprising:
   forming a plurality of strips of sacrificial resin parallel to each other on a first surface of an integrated circuit chip;
   forming a metal layer covering and between the plurality of strips of sacrificial resin;
   forming an encapsulation layer covering the metal layer, an upper surface of the encapsulation layer being planar;
   forming openings in the encapsulation layer extending to ends of the plurality of strips of sacrificial resin; and
   removing the strips of sacrificial resin to obtain a plurality of heat removal channels.

20. The method of claim 19 wherein the metal layer comprises copper.

21. The method of claim 19 wherein forming the plurality of strips of sacrificial resin comprises depositing the sacrificial resin and then etching the deposited sacrificial resin.

* * * * *